(12) United States Patent  
Lee et al.

(10) Patent No.: US 7,588,710 B2  
(45) Date of Patent: Sep. 15, 2009

(54) MOLD MADE OF AMORPHOUS FLUORINE RESIN AND FABRICATION METHOD THEREOF

(75) Inventors: Hong Hie Lee, Seoul (KR); Dahl Young Khang, Seoul (KR)

(73) Assignee: Minuta Technology Co., Ltd. (KR)

( * ) Notice: Subject to any disclaimer, the term of this patent is extended or adjusted under 35 U.S.C. 154(b) by 6 days.

(21) Appl. No.: 11/568,596

(22) PCT Filed: May 4, 2004

(86) PCT No.: PCT/KR2004/001041

§ 371 (c)(1),  
(2), (4) Date: Nov. 2, 2006

(87) PCT Pub. No.: WO2005/105401

PCT Pub. Date: Nov. 10, 2005

(65) Prior Publication Data

US 2007/0210483 A1     Sep. 13, 2007

(51) Int. Cl.  
B29C 33/38   (2006.01)  
B29C 33/40   (2006.01)

(52) U.S. Cl. .................. 264/220; 264/225; 106/38.2

(58) Field of Classification Search ............ 264/220, 264/225, 259, 494, 496; 249/114.1, 115, 249/134; 216/2; 106/38.2; 425/174, 174.4, 425/115, 385, 386, 445, 447, 810

See application file for complete search history.

(56) References Cited

U.S. PATENT DOCUMENTS

| | | | | |
|---|---|---|---|---|
| 4,977,221 A * | 12/1990 | Yoshimura et al. | .......... | 525/356 |
| 5,306,772 A * | 4/1994 | Mimura et al. | ............ | 525/92 A |
| 5,344,304 A * | 9/1994 | Tamura et al. | ............. | 425/195 |
| 5,543,217 A * | 8/1996 | Morgan | ........................ | 428/375 |
| 5,720,703 A * | 2/1998 | Chen et al. | .................... | 492/56 |
| 5,726,247 A * | 3/1998 | Michalczyk et al. | ........ | 525/102 |
| 5,904,886 A * | 5/1999 | Stecker | ........................ | 264/139 |
| 5,919,878 A * | 7/1999 | Brothers et al. | ............. | 526/247 |
| 6,180,288 B1 * | 1/2001 | Everhart et al. | ................ | 430/2 |
| 6,228,294 B1 * | 5/2001 | Lee et al. | ....................... | 264/39 |
| 6,673,287 B2 * | 1/2004 | Breen et al. | ................... | 264/83 |
| 6,818,139 B1 * | 11/2004 | Lee et al. | ....................... | 216/49 |
| 7,060,323 B2 * | 6/2006 | Sugahara et al. | ........ | 427/249.15 |
| 7,070,842 B2 * | 7/2006 | Corveleyn et al. | ........ | 428/36.91 |
| 2002/0167114 A1 * | 11/2002 | Berry | .......................... | 264/322 |
| 2003/0062334 A1 * | 4/2003 | Lee et al. | ....................... | 216/37 |

(Continued)

FOREIGN PATENT DOCUMENTS

JP         02030196 A   *  1/1990

(Continued)

OTHER PUBLICATIONS

Recently Development of the Fluorine Resin, p. 3, vol. 9, New Chemical Materials.

*Primary Examiner*—Philip C Tucker  
*Assistant Examiner*—Dimple N Bodawala  
(74) *Attorney, Agent, or Firm*—Baker & Hostetler, LLP

(57) ABSTRACT

A mold for use in forming a target patterning on a substrate by using a pattern formed at one side of the mold is made of amorphous fluorine resin. The mold is fabricated through a compression molding technique by using a master mold (104) with a pattern structure thereon facing the pattern.

5 Claims, 3 Drawing Sheets

U.S. PATENT DOCUMENTS

2003/0235737 A1* 12/2003 Jeon et al. .................... 429/30
2004/0178523 A1* 9/2004 Kim et al. .................. 264/1.27
2006/0021533 A1* 2/2006 Jeans ......................... 101/327
2006/0214326 A1* 9/2006 Kim et al. ................... 264/225

FOREIGN PATENT DOCUMENTS

| | | | |
|---|---|---|---|
| JP | 03057624 A | * | 3/1991 |
| JP | 05245848 A | * | 9/1993 |
| JP | 2002184719 A | * | 6/2002 |
| WO | 02/36342 | | 5/2002 |

* cited by examiner

MOLD MADE OF AMORPHOUS FLUORINE RESIN AND FABRICATION METHOD THEREOF

TECHNICAL FIELD

The present invention relates to a mold for forming a pattern having various sizes (ranging from nm to cm) on a substrate; and, more particularly, to a mold made of amorphous fluorine resin, which is used for forming a pattern (a hyperfine pattern, a micro pattern, a pattern and the like) on a substrate (a silicon substrate, a ceramic substrate, a metal layer, a polymer layer and the like) in a manufacturing process of an integrated circuit, an electronic device, a photoelectronic device, a magnetic device and the like, and a fabrication method of the mold.

BACKGROUND ART

As well known in the art, in order to manufacture a semiconductor device, an electronic device, a photoelectronic device, a magnetic device, a display device, a microelectromechanical device and the like, a process for forming a micro pattern on a substrate is required to be performed. As a representative technique for forming the micro pattern on the substrate, there is a photolithographic method for forming a micro pattern by using light.

According to the photolithographic method, a polymer material (such as a photoresist and the like) having an optical sensitivity is coated on a substrate on which a material to be patterned is laminated or deposited and, then, the polymer material is exposed to a light through an exposure process which uses a reticle designed with a certain target patterning. Then, the exposed polymer material is removed by a developing process so that a pattern mask or an etching mask having a target patterning may be formed on the material to be patterned. Thereafter, by performing an etching process with the pattern mask, the material laminated on the substrate can be patterned with a desired pattern.

Meanwhile, in the above-described photolithographic method, a circuit line-width or a pattern line-width is dependent on a bandwidth of the light used in the exposure process. Therefore, it is very difficult to form a hyperfine pattern having a line-width smaller than or equal to, e.g., 100 nm, on the substrate by using a conventional photolithographic method.

Further, since such a conventional photolithographic method requires various steps (such as a substrate cleaning process, a substrate surface treatment, a photosensitive polymer coating process, a low temperature heat treatment, an exposure, a developing, a cleaning, a high temperature heat treatment and the like), the method itself becomes complex and a considerable processing time is needed. Besides, high-priced processing equipments are required, thereby increasing a manufacturing cost and deteriorating a productivity.

In order to overcome limits of the conventional photolithographic method, non-conventional lithographic methods are being suggested.

One of the non-conventional lithographic methods is a nano-imprint lithographic method for transferring a pattern of a hard mold to a polymer thin film pattern of a substrate by preparing the hard mold made of silicon (Si) on which a desired pattern is formed and the substrate whose surface is coated with a thermoplastic polymer thin film, facing the hard mold with the substrate, performing a compression on the hard mold and the substrate under a condition of a high temperature and a high pressure by using a plate press, and separating the compressed-mold from the substrate.

Such a nano-imprint lithographic method has an advantage that it is easy to form a hyperfine pattern because the hard mold made of silicon and the like is used. In fact, according to a research, a minimum size of the pattern has been known as about 7 nm.

However, the conventional nano-imprint lithographic method has drawbacks to be described as follows. Above all, it is difficult to separate the mold from the substrate after the compression under the high temperature and the high pressure is terminated. Further, the high pressure during the compression results in a possibility of damaging the mold and the substrate. Moreover, since the patterning is performed by using a fluidity of the high temperatured polymer material, a considerable time is required to complete the patterning described above, especially, in case of a large sized pattern so that a processing time increases.

Other examples of the non-conventional lithographic methods include a micro-contact printing (μCP), a micro-molding in capillaries (MIMIC), a micro-transfer molding (μTM), a soft molding, a capillary force lithography (CFL) and the like. In such methods, it is common that a kind of polymer elastomer of polydimethylsiloxane (PDMS) is used as a mold.

Since the PDMS mold used in the conventional nano-imprint lithographic methods is an elastomer, it is easy for the PDMS mold to be in conformal contact with a surface of a substrate to be patterned. Further, since the PDMS mold has a lower surface energy, an adhesive force of the PDMS mold to a surface of other materials is low enough to enable the PDMS mold to be easily separated from the surface of the substrate after the patterning is terminated. Additionally, its high gas permeability due to a three-dimensional net-work structure results in an easy absorption of a solvent thereinto.

Meanwhile, since the PDMS mold is an elastomer having a low mechanical strength, the PDMS mold may be easily deformed so that the PDMS mold may not be used to form a micro pattern with a pattern size smaller than or equal to, e.g., about 500 μm and highly dependent on an aspect ratio of the pattern to be formed. In addition, the PDMS mold is swollen and deformed by a general organic solvent such as toluene and the like so that a selection of the polymer and the solvent to be used in the patterning may be restricted.

DISCLOSURE OF INVENTION

It is, therefore, an object of the present invention to provide a mold made of amorphous fluorine resin which is easily separable from a substrate on which a pattern will be formed and has a high gas permeability while appropriately maintaining a flexibility and a mechanical strength, and a fabrication method thereof.

In accordance with a preferred embodiment of the present invention, there is provided a mold for use in forming a target patterning on a substrate by using a pattern formed at one side of the mold,
    wherein the mold is made of an amorphous fluorine resin.

In accordance with another preferred embodiment of the present invention, there is provided a mold for use in forming a target patterning on a substrate by using a pattern formed at one side of the mold,
    wherein the mold is made of a composite in which an amorphous fluorine resin and a polymer elastomer are mixed.

In accordance with still another preferred embodiment of the present invention, there is provided a method for fabricating a mold for use in forming a target patterning on a substrate by using a pattern formed at one side of the mold, wherein the mold is fabricated through a compression molding technique by using a master mold with a pattern structure thereon facing the pattern, and the mold is made of an amorphous fluorine resin.

In accordance with still another preferred embodiment of the present invention, there is provided a method for fabricating a mold for use in forming a target patterning on a substrate by using a pattern formed at one side of the mold, wherein the mold is fabricated through an injection molding technique by using a mold box having on one side thereof a pattern structure facing the pattern, and the mold is made of an amorphous fluorine resin.

In accordance with still another preferred embodiment of the present invention, there is provided a method for fabricating a mold for use in forming a target patterning on a substrate by using a pattern formed at one side of the mold, the method comprising the steps of:

arranging a master mold having a pattern structure thereron facing the pattern at a certain location in a container with the pattern structure facing upward;

filling the container with an amorphous fluorine resin solution;

hardening the amorphous fluorine resin solution to generate a hardened amorphous fluorine resin; and separating the hardened amorphous fluorine resin from the master mold.

In accordance with still another preferred embodiment of the present invention, there is provided a method for fabricating a mold for use in forming a target patterning on a substrate by using a pattern formed at one side of the mold, the method comprising the steps of:

mixing a polymer elastomer oligomer with an amorphous fluorine resin solution to generate a mixed solution;

evaporating a solvent to generate a solvent-evaporated mixed solution;

adding a hardening agent to the solvent-evaporated mixed solution to generate a composite;

injecting the composite into a container in which a master mold with a pattern structure facing the pattern is arranged;

hardening the composite to generate a hardened composite; and separating the hardened composite from the master mold.

In accordance with still another preferred embodiment of the present invention, there is provided a method for fabricating a mold for use in forming a target patterning on a substrate by using a pattern formed at one side of the mold, the method comprising the steps of:

mixing a polymer elastomer oligomer, an amorphous fluorine resin and a hardening agent to generate a composite;

injecting the composite into a container in which a master mold with a pattern structure facing the pattern is arranged;

hardening the composite to generate a hardened composite; and separating the hardened composite from the master mold.

BRIEF DESCRIPTION OF DRAWINGS

The above and other objects and features of the present invention will become apparent from the following description of preferred embodiments given in conjunction with accompanying drawings, in which.

BEST MODE FOR CARRYING OUT THE INVENTION

The above and other objects and features of the present invention will become apparent from the following description of preferred embodiments given in conjunction with accompanying drawings.

Hereinafter, preferred embodiments of the present invention will be described in detail with reference to the accompanying drawings.

A prior art in which polydimethylsiloxane (PDMS), i.e., a kind of polymer elastomer, is used to make a mold for forming a pattern on a substrate has drawbacks that the PDMS is easily deformable due to its low mechanical strength and its swelling by an organic solvent. However, unlike the prior art, the present invention uses amorphous teflone to make a mold for forming a pattern (with a size ranging from nm to cm) on a substrate, since the amorphous teflone as a fluorine resin is easily separable from the mold due to its low surface energy and provides an appropriate mechanical strength, a high gas permeability, a non-swelling characteristic against an organic solvent and a conformal contact with a surface of the substrate. The object of the present invention can be achieved by using such technical devices.

Hereinafter, a mold made of amorphous fluorine resin in accordance with the present invention can be fabricated by a compression molding, an injection molding and the like using amorphous fluorine resin powder or by a coating, a casting and the like using amorphous fluorine resin solution.

As the amorphous fluorine resin to be used as a main material of a mold, Teflon AF® developed by Dupont in the United States can be used. The Teflon AF®, which is a kind of amorphous teflone, is a copolymerized polymer resin of TFE (tetrafluoroethylene) and PDD (2, 2-bistrifluoromethyl-4, 5-difluoro-1, 3-dioxole). A copolymerization rate can range from 0 to 100%, and there are commercial products including AF-1600, AF-2400 and the like with a different copolymerization ratio between TFE and PDD.

The mold made of amorphous fluorine resin has following advantages in comparison with the conventional PDMS mold.

First, the mold made of amorphous fluorine resin is easily separable from the substrate due to its low surface energy after a patterning process is terminated.

Second, the mold made of amorphous fluorine resin provides a high gas permeability but the non-swelling against a specific solvent so that the mold is not easily deformable.

Third, the mold made of amorphous fluorine resin has a relatively higher mechanical strength than an elastomer so that the mold enables a hyperfine patterning in which a patterning size is smaller than or equal to, e.g., 500 nm.

Fourth, since the mold made of amorphous fluorine resin can be used to manufacture a very thin and flexible film, it is possible to implement the conformal contact with the substrate.

Hereinafter, a process for fabricating a mold made of amorphous fluorine resin will be described.

Figure 1A:
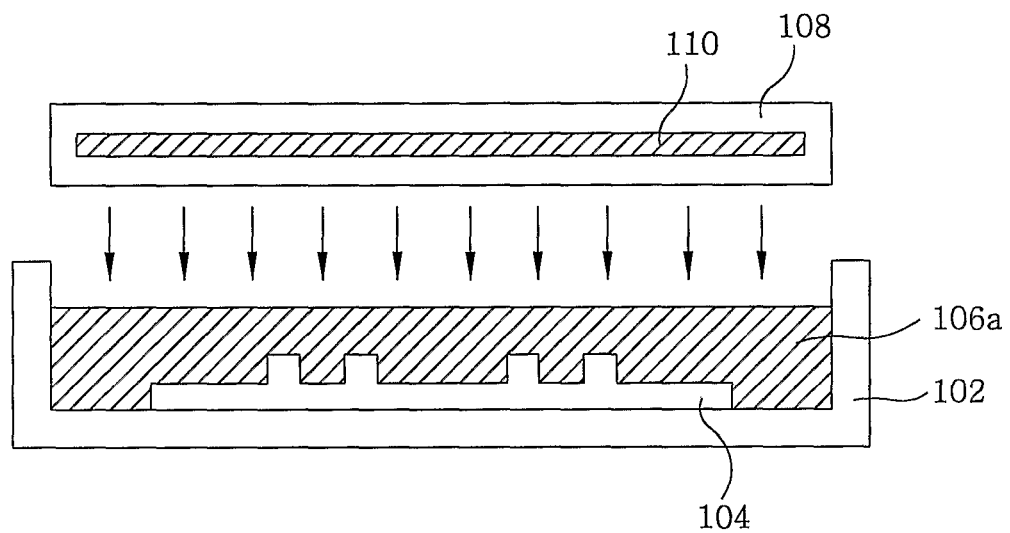
FIGS. 1A and 1B show a process for fabricating a mold made of amorphous fluorine resin in accordance with a first preferred embodiment of the present invention.
Figure 1B:
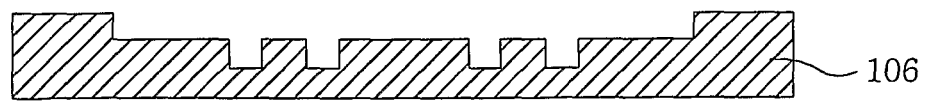

FIGS. 1A and 1B provide flowcharts for showing a process for fabricating the mold made of an amorphous fluorine resin in accordance with a first preferred embodiment of the present invention.

Referring to FIG. 1A, there is illustrated a master mold 104 installed at an inside of a jig 102. The master mold 104 has a certain pattern structure, i.e., a pattern structure facing a pattern of the mold to be fabricated with the pattern structure facing upward. Then, the inside of the jig 102 is filled with teflone AF powder 106a to a desirable thickness.

Next, a plate press for compression; or to be more specific, a plate press 108 having therein a heater 110 is prepared and uses to perform a compression molding on the teflone AF powder 106a for a certain time (e.g., 120 min) under certain processing conditions including a temperature of 340° C. and a pressure of 3000 psi.

Thereafter, the plate press 108 is lifted and the compression molded teflone AF powder 106a is separated from the jig 102, thereby completing a fabrication of the mold 106 having, e.g., a pattern illustrated in FIG. 1B. The mold 106 made of amorphous fluorine resin is used for forming a pattern (with a size ranging from nm to cm) on a substrate.

In the meantime, unlike the above-described method, the mold 106 may be formed by using a compression molding method (a kind of imprint method) involving the steps of: filling a jig with teflone AF powder; compressing the teflone AF powder with a plate press to form a flat plate; and compressing the flat plate by using a master mold having a certain pattern structure.

Moreover, the mold made of fluorine resin in accordance with the present invention can be fabricated by employing an injection molding method in which a molding box having a certain pattern structure (i.e., a pattern structure facing a pattern of a mold to be fabricated by an injection molding) at one side thereof is used on behalf of the above-described compression molding method.

Figure 2A:
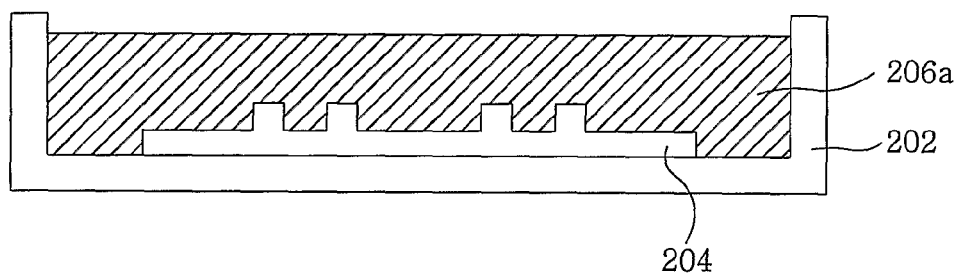
FIGS. 2A and 2B provide a process for fabricating a mold made of amorphous fluorine resin in accordance with a second preferred embodiment of the present invention.
Figure 2B:
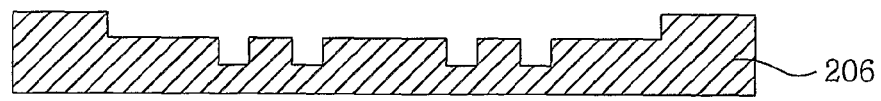

FIGS. 2A and 2B depict flowcharts for illustrating a process for fabricating a mold made of amorphous fluorine resin in accordance with a second preferred embodiment of the present invention.

Referring to FIG. 2A, there is illustrated a master mold 204 installed at an inside of a container 202. The master mold has a certain pattern structure, i.e., a pattern structure facing a pattern of the mold to be fabricated with the pattern structure facing upward. Then, the inside of the container 202 is filled with a desirable amount of teflone AF solution 206a. In this case, a method for filling the container 202 with the solution 206a includes, e.g., a spin coating, a spray coating, a dip coating, a solution casting and the like.

Thereafter, the teflone AF solution is hardened by evaporating a solvent for a certain time (e.g., 240 min) at a certain processing temperature (e.g., 25° C.). Such hardening process can be more rapidly carried out by performing a heat treatment under a high temperature condition (or a high temperature vacuum condition) and by rotating the container 202 containing therein the teflone AF solution at a high speed to facilitate the evaporation of the solvent contained in the solution.

Next, by separating the hardened teflone AF from the container 202, a fabrication of a mold 206 having, e.g., the pattern structure illustrated in FIG. 2B, can be completed. The mold 206 made of amorphous fluorine resin is used for forming a pattern (with a size ranging from nm to cm) on a substrate.

Meanwhile, in this embodiment, a mold having a target thickness can be obtained by repeating desired times a process for filling the container 202 having therein the master mold 204 with the teflone AF solution and evaporating the solvent.

Figure 3A:
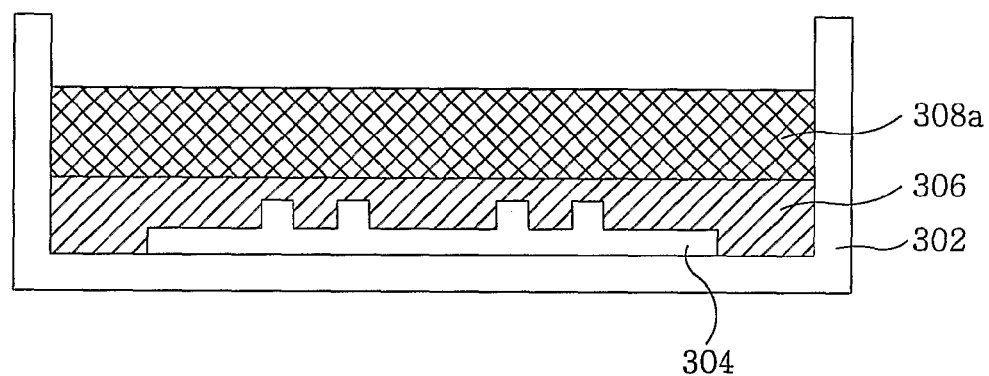
FIGS. 3A and 3B depict a process for fabricating a mold made of amorphous fluorine resin in accordance with a third preferred embodiment of the present invention.
Figure 3B:
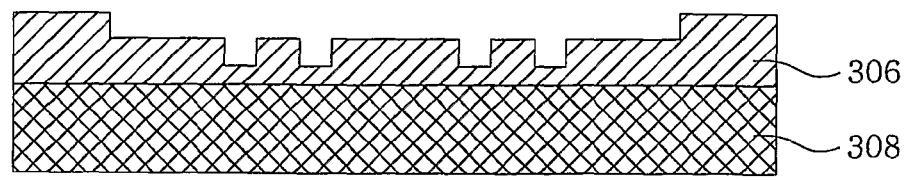

FIGS. 3A and 3B offer flowcharts for showing a process for fabricating a mold made of amorphous fluorine resin in accordance with a third preferred embodiment of the present invention.

Referring to FIG. 3, there is illustrated a master mold 304 installed at an inside of a jig or a container 302 with the pattern structure facing upward. Next, by using the aforementioned methods in accordance with the first or the second embodiment and modified methods thereof, a compression molded or a hardened teflone AF mold layer 306 having a thickness ranging from a few μm to hundreds of μm is formed in the jig or the container 302.

Thereafter, a top portion of the compression molded or the hardened teflone AF mold layer 306 is filled with a polymer elastomer precursor 308a made of, e.g., PDMS and PU and by a certain amount and then the hardening process is performed to harden the polymer elastomer mold precursor 308a to form a polymer elastomer mold layer 308.

Next, the mold having a two-layer structure of the teflone AF mold layer 306 and the polymer elastomer mold layer 308 is separated from the jig or the container 302, thereby completing a fabrication of the mold having the two-layer structure, e.g., a pattern structure illustrated in FIG. 3B. The two-layered mold made of amorphous fluorine resin is used for forming a pattern (with a size ranging from nm to cm) on a substrate.

The mold fabricated in accordance with this embodiment has a structure in which a polymer elastomer (made of PDMS, PU and the like) is attached to the mold made of amorphous fluorine resin so that it is possible to easily form the mold with a pattern of various sizes on a substrate.

In the meantime, a material and a structure of the mold in accordance with the present invention are not limited to an amorphous resin, e.g., teflone, and a two-layer structure in which a polymer elastomer (made of PDMS, PU and the like) is attached to a portion of a teflone structure (on which there is no pattern structure), respectively. Further, the mold can be made of a composite in which the amorphous fluorine resin and the polymer elastomer is mixed.

A composite mold, which is made of a material in which the amorphous fluorine resin such as teflone and the like and the polymer elastomer such as PDMS, PU and the like is mixed, can be fabricated by using a method including the steps of: mixing a polymer elastomer oligomer and a amorphous fluorine resin solution at an appropriate mixing rate; evaporating a solvent; adding a hardening agent thereto to generate a composite through a mixing process; filling a container having therein a master mold with such composite; hardening the composite by using, e.g., heat, ultraviolet rays and the like; and separating the hardened composite from the master mold.

In this case, in order to facilitate a removal of the solvent, it is possible to perform the heat treatment under the high temperature condition or the high temperature vacuum condition or rotate the container at a high speed as illustrated in the aforementioned embodiment.

Further, unlike the above-described method, the composite mold can also be fabricated by employing a method including the steps of: simultaneously mixing very fine amorphous fluorine resin powder having a size of nanometer, a polymer elastomer oligomer and a hardening agent to generate a composite thereof; pouring the composite into a container having therein a master mold; hardening the composite; and separating the hardened composite from the master mold. At this time, the hardening can be carried out by using heat, ultraviolet rays and the like as in the above-described method.

The applicants of the present invention fabricated a mold made of amorphous fluorine resin and then performed an experiment for forming a micro pattern on a substrate by using the mold.

When the amorphous teflone mold is fabricated by using a silicon substrate with a pattern formed thereon as a master mold under a processing condition including a temperature of 340° C., a pressure of 2000 psi and a processing time of 5 minutes and a natural cooling until its temperature reaches a room temperature, the amorphous teflone mold has a pattern with a line and a spacing of 1 μm. A silicon substrate was used as a master mold and polystyrene was used as a material of polymer in this experimental example. Further, a patterning was performed by employing a capillary force lithography using the amorphous teflone mold (under a processing condition: a temperature of 150° C. and a processing time of 30 minutes).

According to the result of the experiment performed by the applicants of the present invention, the amorphous fluorine teflone mold of the present invention is easily separable from a substrate after the patterning is terminated and provides a high gas permeability, a high non-deformation against a specific solvent, a relatively higher mechanical strength than an elastomer, and a conformal contact with a substrate due to its flexibility. Further, by using such amorphous teflone mold, a stable and reliable micro pattern can be formed on a substrate.

A prior art in which PDMS, i.e., a kind of polymer elastomer is used as a mold for forming a pattern on a substrate has drawbacks that the PDMS is easily deformable due to its low mechanical strength and its swelling by an organic solvent. However, unlike the prior art, the presence invention uses amorphous teflone, i.e., amorphous fluorine resin, capable of being easily separated from the mold due to its low surface energy and providing an appropriate mechanical strength, a high gas permeability, a non-swelling characteristics against an organic solvent and a conformal contact with a surface of the substrate, to make in a mold for forming a pattern of various sizes on the substrate so that the mold may be easily separable from the substrate and the mold may provide a high gas permeability, a high non-deformity against a specific solvent, a relatively higher mechanical strength than an elastomer and a conformal contact with a substrate due to its flexibility.

While the invention has been shown and described with respect to the preferred embodiments, it will be understood by those skilled in the art that various changes and modifications may be made without departing from the spirit and scope of the invention as defined in the following claims.

The invention claimed is:

1. A method for fabricating a mold for use in forming a target patterning on a substrate by using a pattern formed at one side of the mold, the method comprising the steps of:
    mixing a polymer elastomer oligomer with an amorphous fluorine resin solution to generate a mixed solution;
    evaporating a solvent to generate a solvent-evaporated mixed solution;
    adding a hardening agent to the solvent-evaporated mixed solution to generate a composite;
    injecting the composite into a container in which a master mold with a pattern structure facing the pattern is arranged;
    hardening the composite to generate a hardened composite; and
    separating the hardened composite from the master mold.

2. The method of claim 1, wherein the evaporating step is facilitated by a high temperature heat treatment process.

3. The method of claim 1, wherein the evaporating step is facilitated by a high temperature vacuum heat treatment process.

4. The method of claim 1, wherein the evaporating step is facilitated by rotating the container at a high speed.

5. The method of claim 2, wherein the hardening step is performed by using heat or an ultraviolet ray.

* * * * *